(12) United States Patent
Lee et al.

(10) Patent No.: US 8,324,649 B2
(45) Date of Patent: Dec. 4, 2012

(54) LIGHT EMITTING DEVICE

(75) Inventors: Sang Youl Lee, Seoul (KR); Hwan Hee Jeong, Seoul (KR); Ji Hyung Moon, Seoul (KR); Young Kyu Jeong, Seoul (KR); Kwang Ki Choi, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/216,932

(22) Filed: Aug. 24, 2011

(65) Prior Publication Data

US 2012/0007121 A1 Jan. 12, 2012

(30) Foreign Application Priority Data

Sep. 17, 2010 (KR) .................. 10-2010-0091970

(51) Int. Cl.
*H01L 33/00* (2010.01)

(52) U.S. Cl. .................. 257/98; 257/99; 257/E33.001; 257/E33.056; 438/25; 438/29

(58) Field of Classification Search .................. 257/79, 257/81, 86, 98, E33.056, E33.062, E33.067, 257/99, E33.001; 438/22, 25, 26, 29
See application file for complete search history.

(56) References Cited

U.S. PATENT DOCUMENTS

| 2007/0145391 | A1* | 6/2007 | Baik et al. ........................ 257/94 |
| 2009/0101923 | A1* | 4/2009 | Choi et al. ....................... 257/89 |
| 2011/0084298 | A1* | 4/2011 | Lai .................................. 257/98 |
| 2012/0018764 | A1 | 1/2012 | Choi et al. |

FOREIGN PATENT DOCUMENTS

| JP | 2010-040761 | 2/2010 | |
| KR | 10-2008-0043649 | 5/2008 | |
| KR | 10-2009-0104931 | 10/2009 | |
| KR | 10-2010-0044726 | 4/2010 | |
| KR | 10-2010-005756 | 5/2010 | ..................... 257/99 |
| KR | 10-0974787 | 8/2010 | |

OTHER PUBLICATIONS

Korean Notice of Allowance dated Jan. 20, 2012 for Application 10-2010-0091970.

* cited by examiner

*Primary Examiner* — Khiem D Nguyen
(74) *Attorney, Agent, or Firm* — KED & Associates, LLP

(57) ABSTRACT

A light emitting device is provided that includes a light emitting structure (including a first conductive type semiconductor layer, an active layer, and a second conductive type semiconductor layer), a conductive layer, an insulation layer, and a current blocking layer. The conductive layer may have a first conductive portion that passes through the second conductive type semiconductor layer and the active layer to contact the first conductive type semiconductor layer. The insulation layer may have a first insulation portion that surrounds the first conductive portion of the conductive layer. The current blocking layer may substantially surround the first insulation portion of the insulation layer, the first insulation portion provided between the current blocking layer and the first conductive portion.

21 Claims, 11 Drawing Sheets

LIGHT EMITTING DEVICE

CROSS-REFERENCE TO RELATED APPLICATION

This application claims priority under 35 U.S.C. §119 from Korean Application No. 10-2010-0091970, filed Sep. 17, 2010, the subject matter of which is incorporated herein by reference.

BACKGROUND

1. Field

Embodiments may relate to a light emitting device.

2. Background

A light emitting diode (LED) is a device for emitting light. Such an LED may be a semiconductor light emitting device for converting an electric signal into light using characteristics of compound semiconductor materials.

The LED may be used for display devices, light sources for liquid crystal displays (LCDs), and lighting devices.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
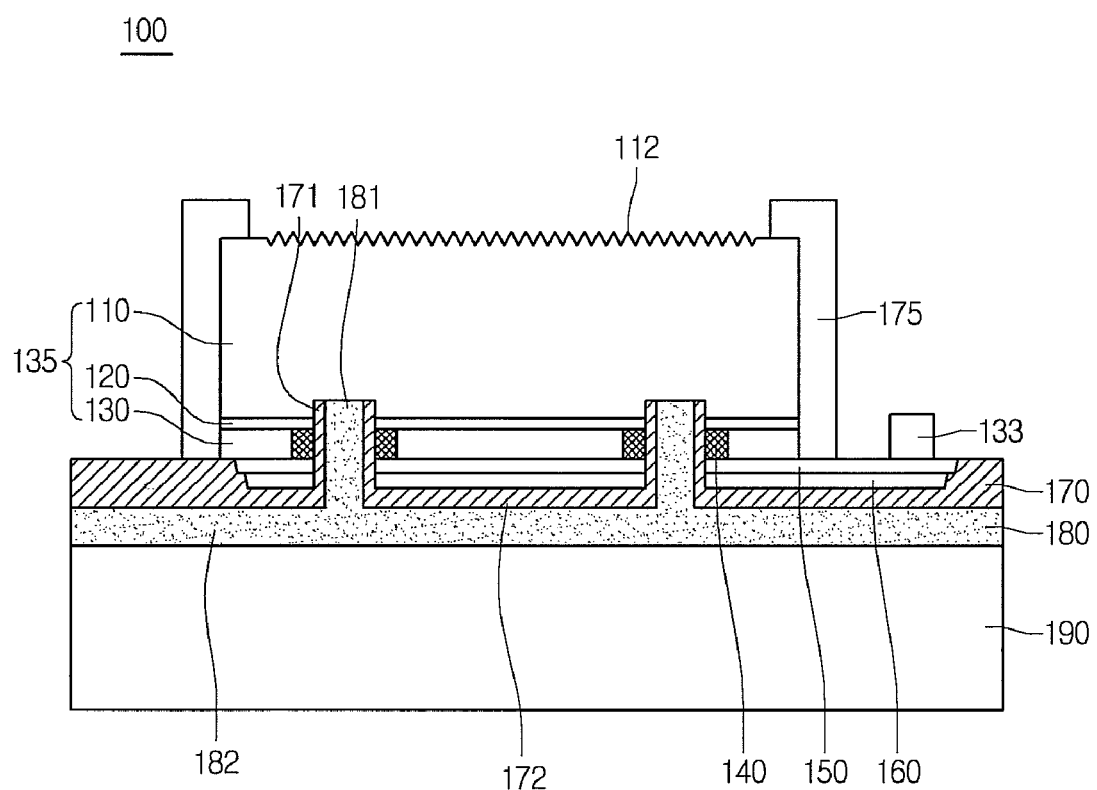
FIG. 1 is a side view of a light emitting device according to a first embodiment.

In the following descriptions, it should be understood that when a layer (or film), a region, a pattern, or a structure is referred to as being 'on' a substrate, a layer (or film), a region, a pad, and/or patterns, it can be directly on another layer or substrate, and/or intervening layers may also be present. Further, it should be understood that when a layer is referred to as being 'under' another layer, it can be directly under another layer, and/or one or more intervening layers may also be present. Further, the reference regarding 'on' and 'under' each layer may be made based on the drawings.

Embodiments may be described with reference to the accompanying drawings. In the drawings, a thickness or a size of each layer may be exaggerated, omitted or schematically illustrated for convenience in description and clarity. The size of each element may not entirely reflect an actual size.

Figure 2:
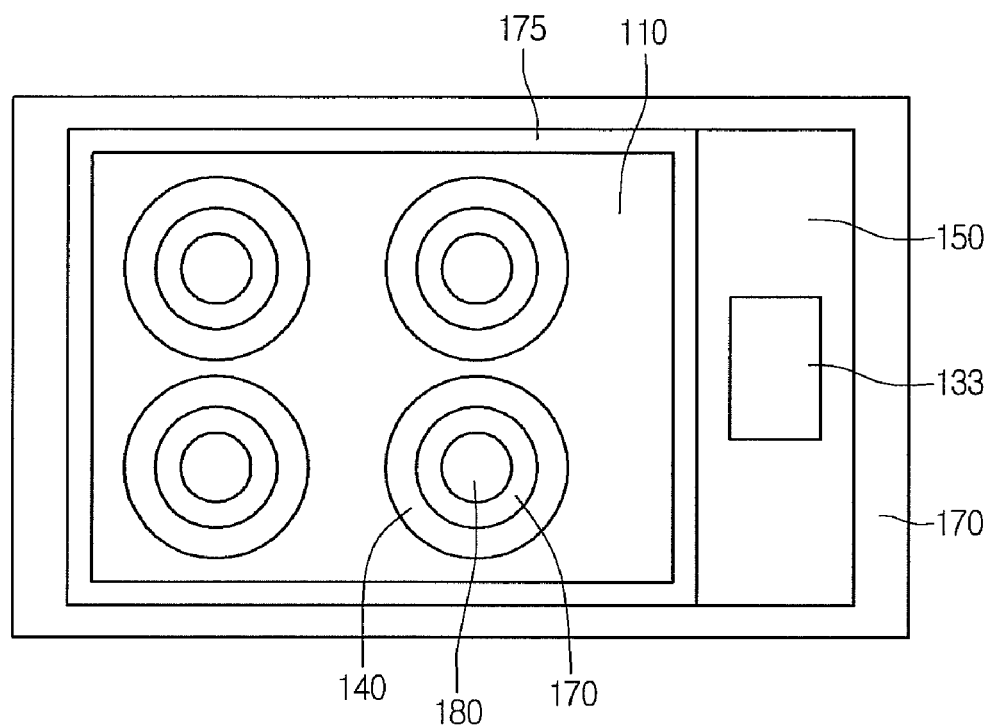
FIG. 2 is a plan view of a light emitting device according to the first embodiment.

FIGS. 1 and 2 are side and plan views of a light emitting device according to a first embodiment. Other embodiments and configurations may also be provided.

As shown in FIG. 1, a light emitting device 100 may include a conductive support member 190, a light emitting structure 135 disposed on the conductive support member 190, an electrode 133 electrically connected to a second conductive type semiconductor layer 130 (of the light emitting structure 135), and a passivation layer 175 disposed on top and side surfaces of the light emitting structure 135.

An ohmic contact layer 150, a reflective layer 160, an insulation layer 170, and a conductive layer 180 may be provided between the conductive support member 190 and the light emitting structure 135.

A current blocking layer 140 may be provided around the insulation layer 170.

As shown in FIG. 2, the current blocking layer 140 may be provided in a circumference region of the insulation layer 170. The current blocking layer 140 may directly contact the insulation layer 170 and/or may be spaced from the insulation layer 170.

The electrode 133 may be disposed above the ohmic contact layer 150 to supply an electric power to the light emitting structure 135.

The light emitting structure 135 may include a first conductive type semiconductor layer 110, an active layer 120, and a second conductive type semiconductor layer 130. Electrons and holes may be provided from the first and second semiconductor layers 110 and 130 to the active layer 120. Thus, the electrons and holes may be recombined with each other in the active layer 120 so as to generate light.

The first conductive type semiconductor layer 110 may be formed of group III-V compound semiconductor materials containing a first conductive type dopant and have a compositional formula of $In_xAl_yGa_{1-x-y}N$ ($0 \leq x \leq 1$, $0 \leq y \leq 1$, $0 \leq x+y \leq 1$). For example, the compound semiconductor material may include one selected from the group consisting of GaN, AlN, AlGaN, InGaN, InN, InAlGaN, AlInN, AlGaAs, GaP, GaAs, GaAsP, and AlGaInP. An N-type dopant such as Si, Ge, Sn, Se, and Te may be used as the first conductive type dopant. The first conductive type semiconductor layer 110 may have a single layer structure or a multi layer structure, although embodiments are not limited thereto.

The active layer 120 may be provided under the first conductive type semiconductor layer 110. The active layer 120 may have one of a single quantum well structure, a multi quantum well (MQW) structure, a quantum dot structure, or a quantum wire structure. The active layer 120 may have a cycle of a well layer and a barrier layer, e.g., an InGaN well layer/GaN barrier layer or an InGaN well layer/AlGaN barrier layer using the group III-V compound semiconductor materials.

A conductive type clad layer may be provided above and/or under the active layer 120. The conductive type clad layer may be formed of an AlGaN-based semiconductor material.

The second conductive type semiconductor layer 130 may be provided under the active layer 120. The second conductive type semiconductor layer 120 may be formed of group III-V compound semiconductor materials containing a second conductive type dopant and may have a compositional formula of $In_xAl_yGa_{1-x-y}N$ ($0 \leq x \leq 2$, $0 \leq y \leq 120$, $0 \leq x+y \leq 1$). For example, the compound semiconductor material may include one selected from the group consisting of GaN, AlN, AlGaN, InGaN, InN, InAlGaN, AlInN, AlGaAs, GaP, GaAs, GaAsP, and AlGaInP. A P-type dopant such as Mg and Zn may be used as the second conductive type dopant.

The light emitting structure 135 may include another semiconductor layer under the second conductive type semiconductor layer 130. To the contrary, the first conductive type semiconductor layer 110 may be a P-type semiconductor layer, and the second conductive type semiconductor layer 130 may be an N-type semiconductor layer. A third conductive type semiconductor layer having a polarity different from that of the first conductive type semiconductor layer 110 may be provided on the first conductive type semiconductor layer 110. Thus, the light emitting structure 135 may have at least one of an N-P junction structure, a P-N junction structure, an N-P-N junction structure, or a P-N-P junction structure. Hereinafter, for ease of description, an example in which a lowermost layer of the light emitting structure 135 is a second conductive type semiconductor layer 130 may be described, although other embodiments may also be provided.

The conductive support member 190 may support the light emitting structure 135 to supply an electric power to the light emitting structure 135 together with the electrode 133. The conductive support member 190 may be electrically connected to the first conductive type semiconductor layer 110, and the electrode 133 may be electrically connected to the second conductive type semiconductor layer 130.

For example, the conductive support member 190 may include at least one selected from the group consisting of copper (Cu), gold (Au), nickel (Ni), molybdenum (Mo), and copper-tungsten. The conductive support member 190 may be a carrier wafer. The conductive layer 180 may be provided on the conductive support member 190. The conductive layer 180 may electrically connect the conductive support member 190 to the first conductive type semiconductor layer 110. The conductive support member 190 and the insulation layer 170 may adhere to each other with the conductive layer 180. The conductive layer 180 may prevent a material of the insulation layer 170 from being diffused into the conductive support member 190, or the conductive layer 180 may prevent a material of the conductive support member 190 from being diffused into the insulation layer 170.

Another conductive layer may be further provided to enhance an adhesion force between the conductive layer 180 and the conductive support member 190.

The conductive layer 180 may be physically separated from or electrically insulated from the active layer 120, the second conductive type semiconductor layer 130, the ohmic contact layer 150, and the reflective layer 160 with the insulation layer 170.

The conductive layer 180 may be formed of a metal material having a superior conductivity, e.g., at least one selected from the group consisting of Ti, Au, Sn, Ni, Cr, Ga, In, Bi, Cu, Ag, and Ta.

The conductive layer 180 may pass through the reflective layer 160, the ohmic contact layer 150, the second conductive type semiconductor layer 130, and the active layer 120 to contact the first conductive type semiconductor layer 110.

The conductive layer 180 may include a first conductive portion 181 that passes through an opening of the second conductive type semiconductor layer 130 and an opening of the active layer 120 to contact the first conductive type semiconductor layer 110. The first conductive portion 181 may extend to the first conductive type semiconductor layer 110 to contact the first conductive type semiconductor layer 110. The conductive layer 180 may also include a second conductive portion 182 that is provided between the conductive support member 190 and the ohmic contact layer 150 and the reflective layer 160.

The insulation layer 170 may be disposed in a region other than a contact region in which the conductive layer 180 contacts the first conductive type semiconductor layer 110. A portion of the insulation layer 170 may extend up to the first conductive type semiconductor layer 110. Thus, top and side surfaces of the insulation layer 170 may contact the first conductive type semiconductor layer 110. The insulation layer 170 may electrically insulate the conductive layer 180 from other layers (e.g., the first active layer 120, the second conductive type semiconductor layer 130, the ohmic contact layer 150, and the reflective layer 160) to prevent the conductive layer 180 from being electrically short-circuited. The insulation layer 170 may be formed of an insulating and light-transmitting material (e.g., one selected from the group consisting of $SiO_2$, $SiO_x$, $SiO_xN_y$, $Si_3N_4$ and $Al_2O_3$).

The insulation layer 170 may include a first insulation portion 171 that surrounds the first conductive portion 181 of the conductive layer 180. The first insulation portion 171 may pass through the opening of the active layer 120 and through the opening of the second conductive type semiconductor layer 130. The first insulation portion 171 may extend to the first conductive type semiconductor layer 110 to contact the first conductive type semiconductor layer 110. The insulation layer 170 may also include a second insulation portion 172 that is provided between the second conductive portion 182 and the ohmic contact layer 150 (and/or the reflective layer 160).

The ohmic contact layer 150 may be disposed under the second conductive type semiconductor layer 130. The ohmic contact layer 150 may ohmic-contact the second conductive type semiconductor layer 130 to smoothly supply an electrical power to the light emitting structure 135. A light-transmitting conductive layer and a metal may be selectively used as the ohmic contact layer 150. For example, the ohmic contact layer 150 may be a single layer or a multi layer by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Pt, Ni/$IrO_x$/Au, or Ni/$IrO_x$/Au/ITO.

Although the ohmic contact layer 150 and the reflective layer 160 are provided in the first embodiment, at least one of the ohmic contact layer 150 or the reflective layer 160 may not be provided. For example, only the ohmic contact layer 150 may be provided, and/or only the reflective layer 160 may be provided.

A first portion of the ohmic contact layer 150 may vertically overlap the light emitting structure 135, and a second portion of the ohmic contact layer 150 may not vertically overlap the light emitting structure 135 and may be exposed to the outside of the light emitting device 100. The first portion of the ohmic contact layer 150 may be provided under the light emitting structure 135. The second portion of the ohmic contact layer 150 may not be provided under the light emitting structure 135, but rather is provided at an area other than under the light emitting structure 135.

The electrode 133 may be spaced from the light emitting structure 135 and/or may be provided at a side of the light emitting structure 135.

The electrode 133 may contact a top surface of the ohmic contact layer 150 (at the second portion of the ohmic contact layer 150).

The ohmic contact layer 150 may horizontally extend from a lower surface of the light emitting structure 135 to a lower surface of the electrode 133. That is, the ohmic contact layer 150 may contact a lower surface of the electrode 133 and may extend horizontally from a lower surface of the electrode 133, and the ohmic contact layer 150 may contact the light emitting structure (i.e., a lower surface of the second conductive type semiconductor layer 130). Thus, the electrode 133 and the second conductive type semiconductor layer 130 may be electrically connected to each other by the ohmic contact layer 150.

The passivation layer 175 may contact a portion of a top surface of the light emitting structure 135, a side surface of the light emitting structure, and/or the top surface of the second portion of the ohmic contact layer 150.

The ohmic contact layer 150 may electrically connect the electrode 133 (provided at the outside of the passivation layer 175) to the light emitting structure 135 (provided at the inside of the passivation layer 175).

The reflective layer 160 may be provided under the ohmic contact layer 150. The reflective layer 160 may reflect light incident from the light emitting structure 135 to improve light emitting efficiency of the light emitting device 100.

For example, the reflective layer 160 may be formed of a metal or alloy containing at least one selected from the group consisting of Ag, Ni, Al, Rh, Pd, Ir, Ru, Mg, Zn, Pt, Au, and Hf. Alternatively, the reflective layer 160 may be formed with a multi layered structure using a light-transmitting and conductive material, e.g., at least one selected from the group consisting of ITO, IZO, IZTO, IAZO, IGZO, IGTO, AZO, ATO as well as the metal or alloy. For example, the reflective layer 160 may include at least one selected from the group consisting of IZO/Ni, AZO/Ag, IZO/Ag/Ni and AZO/Ag/Ni.

The reflective layer 160 may have an area substantially equal to that of the ohmic contact layer 150. Since the reflective layer 160 contacts the under surface of the ohmic contact layer 150, the reflective layer 160 may have a shape that is substantially equal to that of the ohmic contact layer 150.

That is, the reflective layer 160 may have a first portion that vertically overlaps the light emitting structure 135 and a second portion that does not vertically overlap the light emitting structure 135. The first portion of the reflective layer 160 may be provided under the light emitting structure 135. The second portion of the reflective layer 160 may not be provided under the light emitting structure 135, but rather is provided at an area other than under the light emitting structure 135.

The reflective layer 160 may extend from the lower surface of the second conductive type semiconductor layer 130 up to the lower surface of the electrode 133. Thus, like the ohmic contact layer 150, the reflective layer 160 may electrically connect the electrode 133 (provided at the outside of the passivation layer 175) to the second conductive type semiconductor layer 130 (provided at the inside of the passivation layer 175) through the ohmic contact layer 150.

When the ohmic contact layer 150 is not provided, the second conductive type semiconductor layer 130 and the electrode 133 may be directly and electrically connected to the each other by the reflective layer 160.

The reflective layer 160 may reflect light emitted from the light emitting structure 135 upwardly as well as provide a current applied from the electrode 133 into the light emitting structure 135.

The current blocking layer (CBL) 140 may directly contact the insulation layer 170.

The CBL 140 may prevent a current from being concentrated with a shortest current path between the conductive layer 180, which serves as an electrode, and the ohmic contact layer 150 (or the reflective layer 160). That is, the shortest current path interval between the conductive layer 180 and the ohmic contact layer 150 (or the reflective layer 160) may be defined between a region in which the conductive layer 180 contacts the first conductive type semiconductor layer 110 and a region in which the insulation layer 170 contacts the ohmic contact layer 150. Thus, since a current is concentrated in the shortest current path interval, there may be a problem that the current is not uniformly spread into the entire region of the first conductive type semiconductor layer 110.

To solve the above-described problem, the CBL 140 may be provided around the shortest current path interval in the first embodiment. Thus, the current concentrated into the shortest current path interval may be spread into a peripheral region (i.e., the inside of the first conductive type semiconductor layer 110 away from the insulation layer 170) to maximize the light emitting efficiency of the light emitting device 100.

The CBL 140 may vertically overlap the insulation layer 170 provided under the reflective layer 160 and may be spaced from the insulation layer 170 provided under the reflective layer 160 with the ohmic layer 150 or the reflective layer 160 therebetween. For example, the CBL 140 may horizontally protrude from the insulation layer 170.

The CBL 140 may be provided between the active layer 120 and at least one of the ohmic contact layer 150 or the reflective layer 160.

The CBL 140 may be provided between the insulation layer 170 and the second conductive type semiconductor layer 130.

The CBL 140 may be provided within a same layer as the second conductive type semiconductor layer 130.

The CBL 140 may have an electrical conductivity less than that of the ohmic contact layer 150 or the reflective layer 160, or the CBL 140 may have an electrical conductivity greater than that of the ohmic contact layer 150 or the reflective layer 160. The CBL 140 may be formed of a material that schottky-contacts the second conductive type semiconductor layer 130.

For example, the CBL 140 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$ and $TiO_x$r. The $SiO_2$, $SiO_x$, $SiO_xN_y$, $Si_3N_4$, and $Al_2O_3$ may be insulation materials.

The CBL 140 may be formed of a same material as the insulation layer 170 or a material different from the insulation layer 170.

When the CBL 140 is formed of the same material as the insulation layer 170, the CBL 140 and the insulation layer 170 may be manufactured at a same time through one process. Thus, a number of process and process costs may be reduced.

The CBL 140 may substantially surround the first insulation portion 171 of the insulation layer 170 such that the first insulation portion 171 is provided between the CBL 140 and the first conductive portion 181. As shown in FIG. 2, the CBL 140 may circumferentially surround the first insulation portion 171. In one embodiment, the CBL 140 may fully circumferentially surround the first insulation portion 171. In another embodiment, the CBL 140 may surround almost all of the circumference of the first insulation portion 171. The remaining portion of the circumference may be filled with another material, such as a semiconductive material.

The first insulation portion 171 of the insulation layer 170 may surround the first conductive portion 181 of the conductive layer 180.

Although FIG. 2 shows that the first conductive portion 181 of the conductive layer 180 is a circular shape, the conductive layer 180, the first insulation portion 171 and/or the current blocking layer 140 may be provided in other shapes such as a square, for example.

The electrode 133 may be provided on the ohmic contact layer 150. The electrode 133 may be an electrode pad or have an electrode pattern with the electrode pad. The electrode pattern may be branched from each other in a branch shape.

The electrode 133 may be realized as a single layer or a multi layer using at least one material selected from the group consisting of Ti, Al, In, Ta, Pd, Co, Ni, Si, Ge, Ag, Au, Hf, Pt, Ru, and Au, or alloys thereof.

Since the electrode 133 is provided at the side of the light emitting structure 135 rather than a top surface of the first conductive type semiconductor layer 110, absorption of light traveling in a vertical direction (i.e., a chip surface direction) may be reduced.

That is, since the electrode 133 does not vertically overlap the light emitting structure 135 (including the first conductive type semiconductor layer 110) and is horizontally spaced from the light emitting structure 135, a phenomenon in which light emitted from the light emitting structure 135 to travel upwardly is absorbed into the electrode 133 may be reduced.

A light extraction pattern 112 may be provided on the top surface of the first conductive type semiconductor layer 110. The light extraction pattern 112 may minimize (or reduce) an amount of light totally-reflected by a surface thereof to improve the light extraction efficiency of the light emitting device 100. The light extraction pattern 112 may have an unevenness shape, although embodiments are not limited thereto.

The light emitting device 100 may improve a current distribution. Therefore, the light emitting device 100 may have an advantage in that the light extraction efficiency may be superior.

FIGS. 3 to 11 are views illustrating a process of manufacturing the light emitting device according to the first embodiment. Other views and embodiments may be provided.

Figure 3:
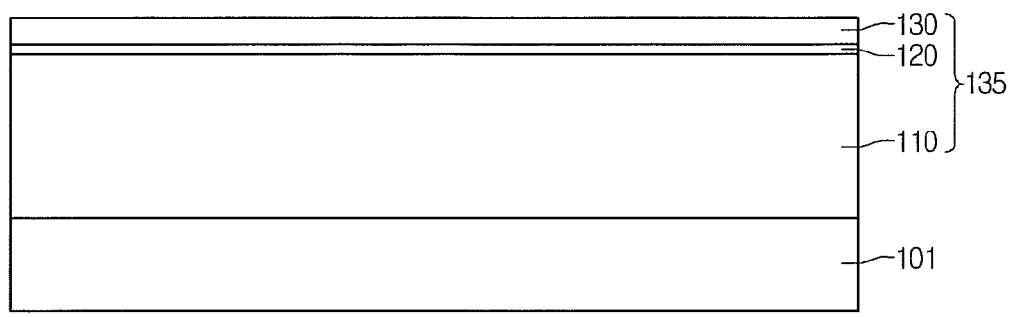
FIGS. 3 to 11 are views illustrating a process of manufacturing the light emitting device according to the first embodiment.

As shown in FIG. 3, the light emitting structure 135 may be formed on a growth substrate 101.

For example, the growth substrate 101 may include at least one selected from the group consisting of sapphire ($Al_2O_3$), SiC, GaAs, GaN, ZnO, Si, GaP, InP, and Ge, although embodiments are not limited thereto.

The light emitting structure 135 may be formed by successively growing the first conductive type semiconductor layer 110, the active layer 120, and the second conductive type semiconductor layer 130 on the growth substrate 101.

For example, the light emitting structure 135 may be formed using one selected from the group consisting of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, although embodiments are not limited thereto.

The first conductive type semiconductor layer 110 may be formed of a group III-V compound semiconductor in which a first conductive type dopant is doped, e.g., one selected from the group consisting of GaN, AlN, AlGaN, InGaN, InN, InAlGaN, AlInN, AlGaAs, GaP, GaAs, GaAsP, and AlGaInP. When the first conductive type semiconductor layer 110 is an N-type semiconductor layer, the first conductive type dopant may include an N-type dopant such as Si, Ge, Sn, Se, and Te. The first conductive type semiconductor layer 110 may have a single or multi-layered structure, although embodiments are not limited thereto.

The active layer 120 may be formed on the first conductive type semiconductor layer 110. The active layer 120 may have a single quantum well structure or a multi quantum well (MQW) structure. The active layer 120 may have a cycle of a well layer and a barrier layer, e.g., an InGaN well layer/GaN barrier layer or a cycle of an InGaN well layer/AlGaN barrier layer using the group III-V compound semiconductor material.

A conductive type clad layer may be provided above and/or under the active layer 120. The conductive type clad layer may be formed of an AlGaN-based semiconductor material.

The second conductive type semiconductor layer 130 may be formed on the active layer 120. The second conductive type semiconductor layer 130 may be formed of group III-V compound semiconductor materials in which a second conductive type dopant is doped (e.g., one of GaN, AlN, AlGaN, InGaN, InN, InAlGaN, AlInN, AlGaAs, GaP, GaAs, GaAsP, and AlGaInP). When the second conductive type semiconductor layer 130 is a P-type semiconductor layer, the second conductive type dopant may include a P-type dopant such as Mg and Ze. The second conductive type semiconductor layer 130 may have a single or multi-layered structure, although embodiments are not limited thereto.

A buffer layer for reducing a lattice constant between the light emitting structure 135 and the growth substrate 101 may be formed therebetween.

Figure 4:
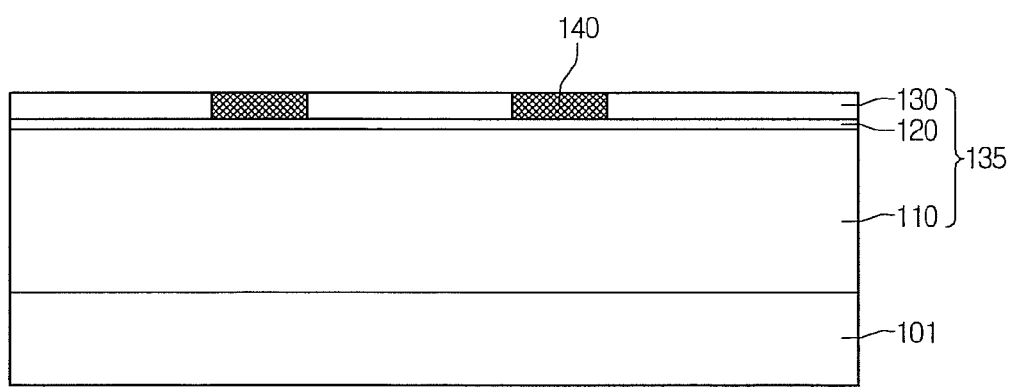

As shown in FIG. 4, the current blocking layer 140 may be formed in a portion of the second conductive type semiconductor layer 130. For example, the current blocking layer 140 may inject at least one ion of N, Si, and O to form one of $SiO_2$, $SiO_x$, $SiO_xN_y$, $Si_3N_4$ and $Al_2O_3$. The current blocking layer 140 may be formed of one selected from the group consisting of ITO, IZO, IZTO, IAZO, IGZO, IGTO, AZO, ATO, and ZnO.

Figure 5:
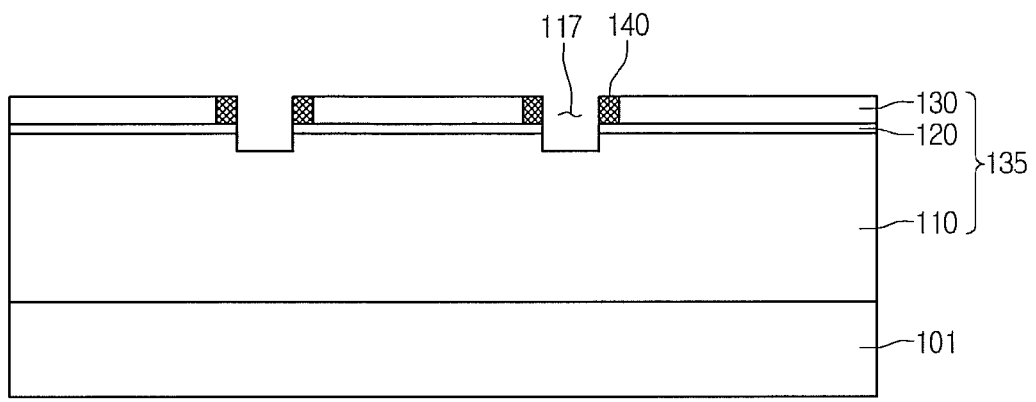

As shown in FIG. 5, the light emitting structure 135 may be selectively removed to form at least one recess 117 so that a portion of the first conductive type semiconductor layer 110 is exposed. The current blocking layer 140 may be formed in a circumference region of the recess 117.

The recess 117 may be formed by an etching process including a wet etching process and a dry etching process or a laser process, although embodiments are not limited thereto. The light emitting structure 135 having the recess 117 may have a side surface perpendicular or inclined with respect to a bottom surface of the recess 117. The side surface of the light emitting structure 135 may be perpendicular or inclined with respect to a circumferential surface of the light emitting structure 135.

Figure 6:
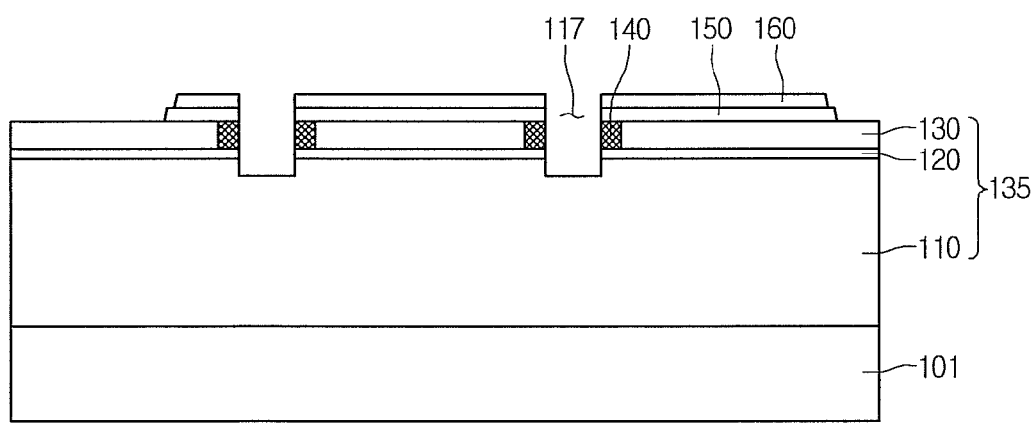

As shown in FIG. 6, the ohmic contact layer 150 may be formed on the second conductive type semiconductor layer 130. The reflective layer 160 may be formed on the ohmic contact layer 150. For example, the ohmic contact layer 150 and/or the reflective layer 160 may be formed using one of an E-beam deposition process, a sputtering process, or a plasma enhanced chemical vapor deposition (PECVD) process.

Figure 7:
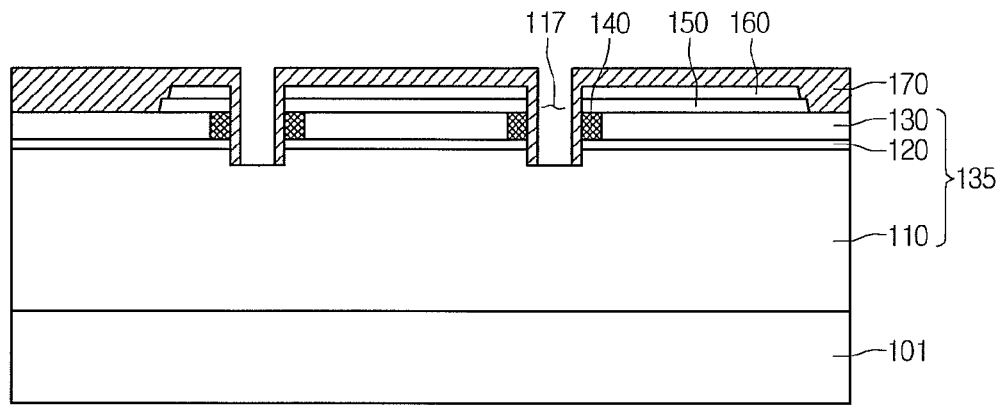

As shown in FIG. 7, the insulation layer 170 may be formed on an inner surface of the light emitting structure 135, which may be etched to form the recess 117, and on the reflective layer 160. The insulation layer 170 may prevent the light emitting structure 135 from being electrically short-circuited.

For example, the insulation layer 170 may be formed of an insulating and light-transmitting material (e.g., one of $SiO_2$, $SiO_x$, $SiO_xN_y$, $Si_3N_4$, $Al_2O_3$).

Figure 8:
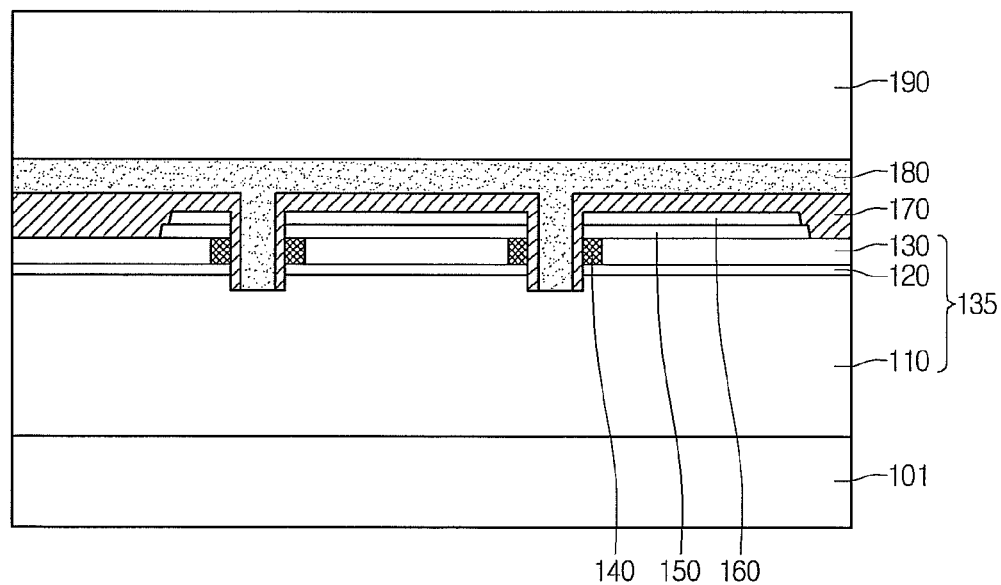

As shown in FIG. 8, the conductive layer 180 is formed on the insulation layer 170. The conductive support member 190 may be formed on the conductive layer 180.

The conductive layer 180 may be electrically connected to the conductive support member 190 and the first conductive type semiconductor layer 110.

The conductive support member 190 may be prepared as a separate sheet. The conductive support member 190 may be formed using a bonding process in which the sheet is attached to the conductive layer 180. Alternatively, the conductive support member 190 may be formed using a plating process or a deposition process, although embodiments are not limited thereto.

Figure 9:
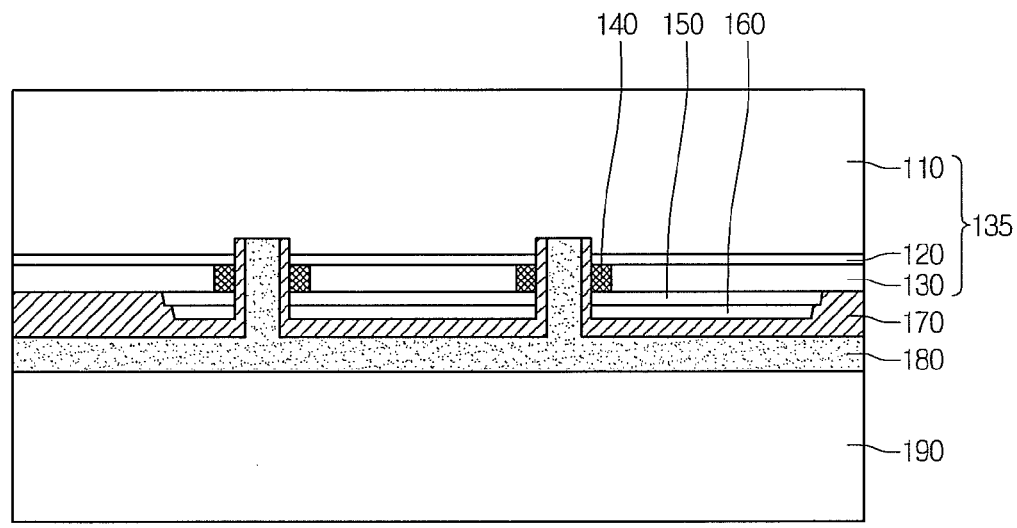

As shown in FIG. 9, the growth substrate 101 may be removed. The growth substrate 101 may be removed using at least one of a laser lift off process or an etching process.

The growth substrate 101 may be removed to expose a surface of the first conductive type semiconductor layer 110.

Figure 10:
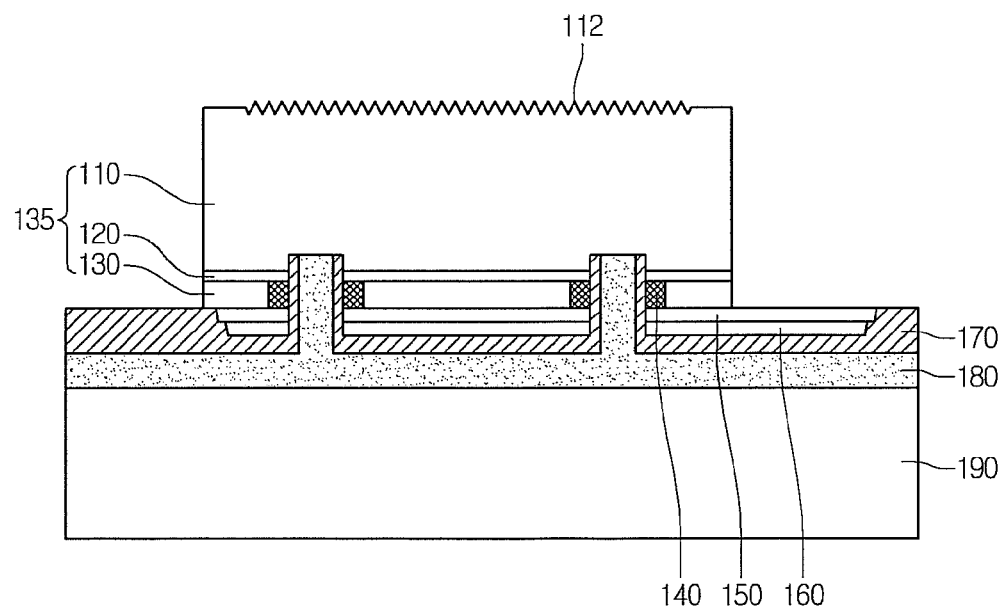

As shown in FIG. 10, an isolation etching process may be performed on the light emitting structure 135 along a unit chip region to divide the light emitting structure 135 into a plurality of light emitting structures 135. For example, the isolation etching process may be performed through a dry etching process such as an inductively coupled plasma (ICP) process or a wet etching using an etchant such as KOH, $H_2SO_4$, $H_3PO_4$, although embodiments are not limited thereto.

The isolation etching process may be performed to etch a side surface of the light emitting structure 135, thereby exposing portions of top surfaces of the ohmic contact layer 150 and the insulation layer 170.

The light extraction pattern 112 may be formed on a top surface of the first conductive type semiconductor layer 110. The light extraction pattern 112 may have a random shape and arrangement and/or a specific shape and arrangement.

A wet etching process may be performed on the top surface of the light emitting structure 135 and/or a physical process (such as a polishing process) may be performed to form the light extraction pattern 112 having the random shape.

When the light extraction pattern 112 has a specific shape, a pattern mark including a pattern having a shape corresponding to the shape of the light extraction pattern 112 may be formed on the top surface of the first conductive type semiconductor layer 110 and an etching process may be performed along the pattern mask to form the light extraction pattern 112 having the specific shape and arrangement.

Figure 11:
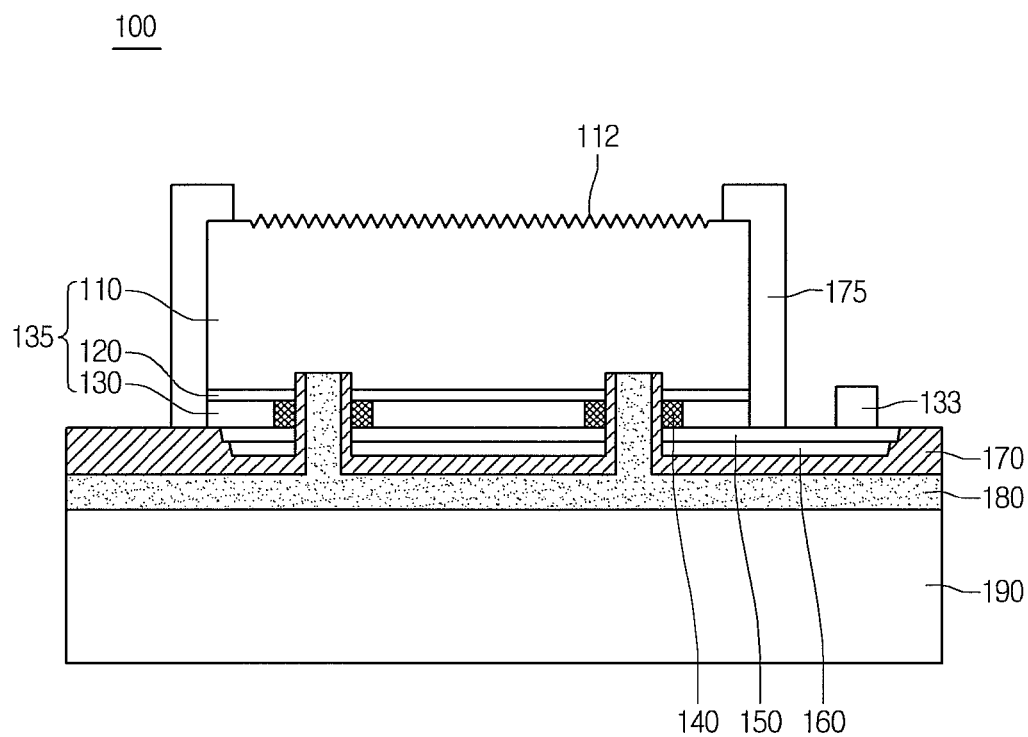

As shown in FIG. 11, the passivation layer 175 may be formed on a side surface of the light emitting structure 135 and a portion of the first conductive type semiconductor layer 110. For example, the passivation layer 175 may be formed of an insulating and light-transmitting material (e.g., one of $SiO_2$, $SiO_x$, $SiO_xN_y$, Si3N4, $Al_2O_3$).

The passivation layer 175 may be formed using a sputtering process or a plasma enhanced chemical vapor deposition (PECVD) process.

The electrode 113 may be formed on the first conductive type semiconductor layer 110. The electrode 113 may be branched in a predetermined pattern shape, although embodiments are not limited thereto.

Since the light extraction pattern 112 is formed on the first conductive type semiconductor layer 110, a pattern corresponding to the light extraction pattern 112 may be smoothly formed on a top surface of the electrode 113 by the manufacturing process.

The electrode 113 may contact the top surface of the first conductive type semiconductor layer (i.e., an N-face surface). The electrode 113 may have a structure in which at least one pad and an electrode pattern having at least one shape and connected to the pad are equally or differently stacked with each other.

The electrode 113 may be realized as a single layer or a multi layer using at least one material of Ti, Al, In, Ta, Pd, Co, Ni, Si, Ge, Ag, Au, Hf, Pt, Ru, and Au, or alloys thereof.

Figure 12:
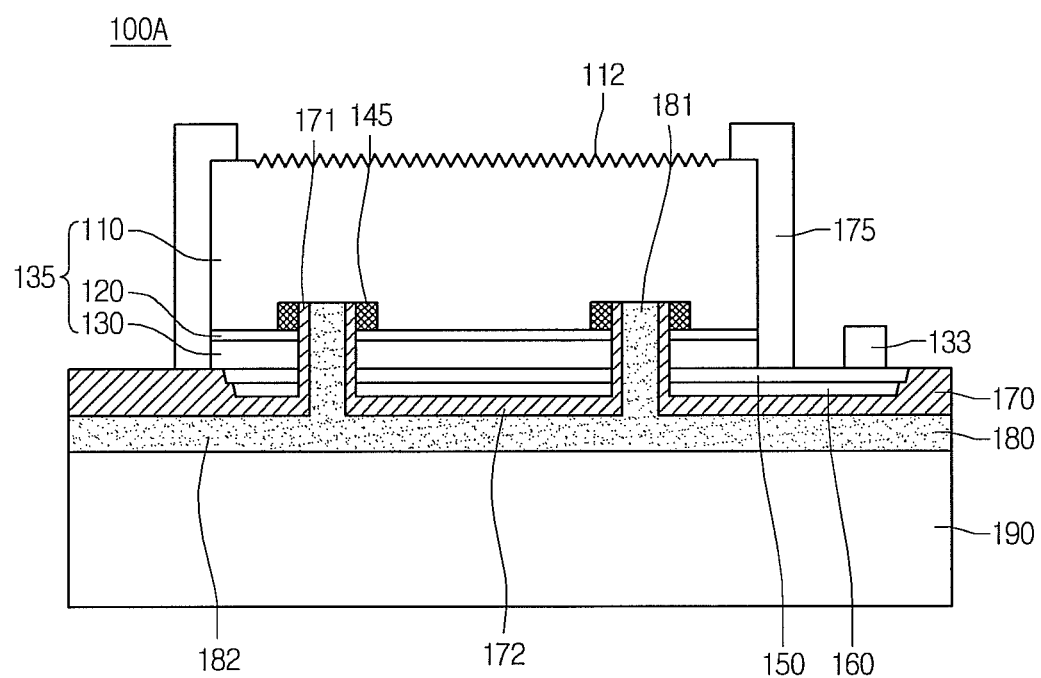
FIG. 12 is a side view of a light emitting device according to a second embodiment.

FIG. 12 is a side view of a light emitting device according to a second embodiment. Other embodiments and configurations may also be provided.

The second embodiment may be similar to the first embodiment other than a formation position of a current blocking layer 145. Thus, functions and configurations of other components according to the second embodiment may be similar to components according to the first embodiment. Thus, descriptions of some of the components of the second embodiment may be omitted.

As shown in FIG. 12, a light emitting device 100A according to the second embodiment may include the conductive support member 190, the light emitting structure 135 on the conductive support member 190, the conductive layer 180 passing through the light emitting structure 135 upwardly from a lower surface to contact the first conductive type semiconductor layer 110 that is the uppermost layer of the light emitting structure 135, the insulation layer 170 around the conductive layer 180, the current blocking layer 145 around the insulation layer 170, and the electrode 133 spaced from the light emitting structure 135 and/or provided at a side of the light emitting structure 135.

At least one of the ohmic contact layer 150 or the reflective layer 160 may be provided between the conductive support member 190 and the light emitting structure 135.

A portion of the conductive layer 180 may pass through at least one of the ohmic contact layer 150 or the reflective layer 160 to extend to a lower surface of at least one of the ohmic contact layer 150 or the reflective layer 160.

A portion of the insulation layer 170 may be provided between at least one of the ohmic contact layer 150 or the reflective layer 160 and the conductive layer 180.

Descriptions with respect to the passivation layer 175 and the light extraction pattern 112 may be easily understood with reference to the first embodiment.

Surfaces of the current blocking layer 145 may be surrounded by the first insulation portion 171 of the insulation layer 170, the active layer 120, and the first conductive type semiconductor layer 110.

The current blocking layer 145 may horizontally protrude from the insulation layer 170.

The current blocking layer 145 may be provided within the first conductive type semiconductor layer 110.

A lower surface of the current blocking layer 145 may directly contact the active layer 120, although embodiments are not limited thereto. The lower surface of the current blocking layer 145 may also be spaced from a top surface of the active layer 120.

The current blocking layer 145 may have a top surface having a height equal to the first insulation portion 171 of the insulation layer 170. The current blocking layer 145 may also have a top surface that is higher than an end of the first insulation portion 171 of the insulation layer 170. The top surface of the current blocking layer 140 may not be parallel with an end of the first insulation portion 171.

As described above, since the current blocking layer 145 is provided within the first conductive type semiconductor layer 110 in which spreading of the current is beneficial, the current blocking layer 145 may spread the current into an entire region of the first conductive type semiconductor layer 110 when compared to the first current blocking layer 140 according to the first embodiment. Therefore, light emitting efficiency may be further maximized (or increased).

Figure 13:
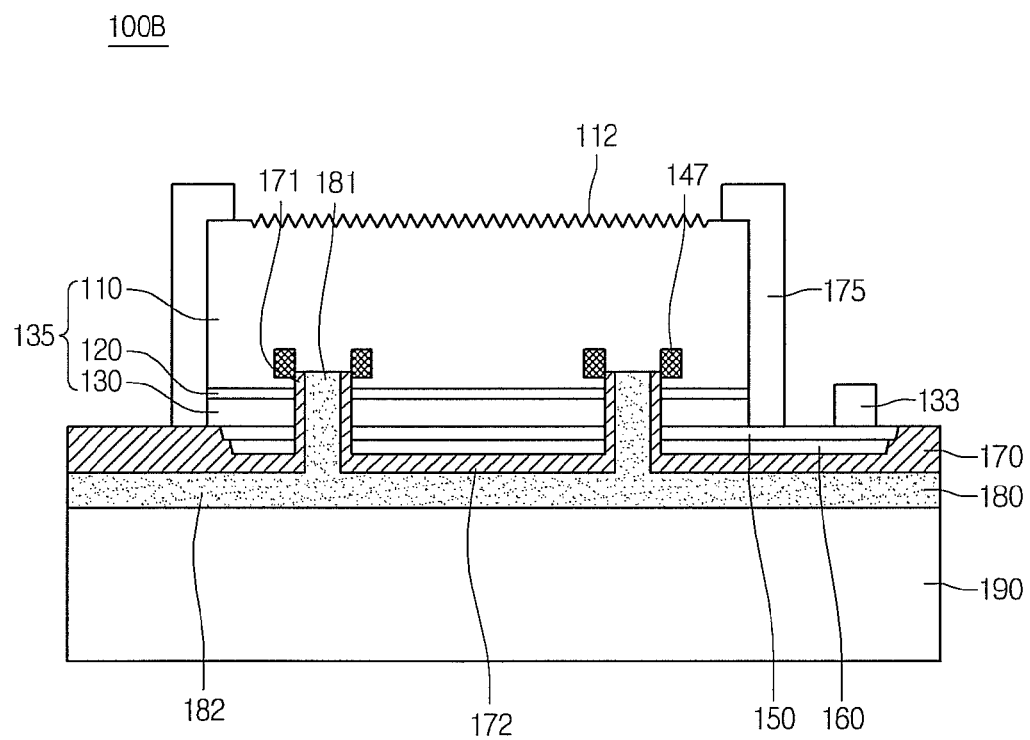
FIG. 13 is a side view of a light emitting device according to a third embodiment.

FIG. 13 is a side view of a light emitting device according to a third embodiment. Other embodiments and configurations may also be provided.

The third embodiment may be similar to the first embodiment other than a formation position of a current blocking layer 147. Thus, functions and configurations of other components according to the third embodiment may be similar to components according to the first embodiment. Thus, descriptions of some of the components of the third embodiment may be omitted.

As shown in FIG. 13, a light emitting device 100B according to the third embodiment may include the conductive support member 190, the light emitting structure 135 on the conductive support member 190, the conductive layer 180 passing through the light emitting structure 135 upwardly from a lower surface to contact the first conductive type semiconductor layer 110 that is the uppermost layer of the light emitting structure 135, the insulation layer 170 around the conductive layer 180, the current blocking layer 147 around the insulation layer 170, and the electrode 133 spaced from the light emitting structure 135 and/or provided at a side of the light emitting structure 135.

A lower surface of the current blocking layer 147 is spaced from the active layer 120. In other words, the current blocking layer 147 does not contact the active layer 120.

A portion of the first conductive type semiconductor layer 110 is provided between the current blocking layer 147 and the active layer 120.

The current blocking layer 147 has a surface higher than an end of the first insulation portion 171 of the insulation layer 170. The end of the first insulation portion 171 of the insulation layer 170 contacts the first conductive type semiconductor layer 110.

As described above, since the current blocking layer 147 is provided within the first conductive type semiconductor layer 110 in which spreading of the current is beneficial, the current blocking layer 147 may spread the current into an entire region of the first conductive type semiconductor layer 110 when compared to the first current blocking layer 140 according to the first embodiment. Therefore, light emitting efficiency may be further maximized (or increased).

Figure 14:
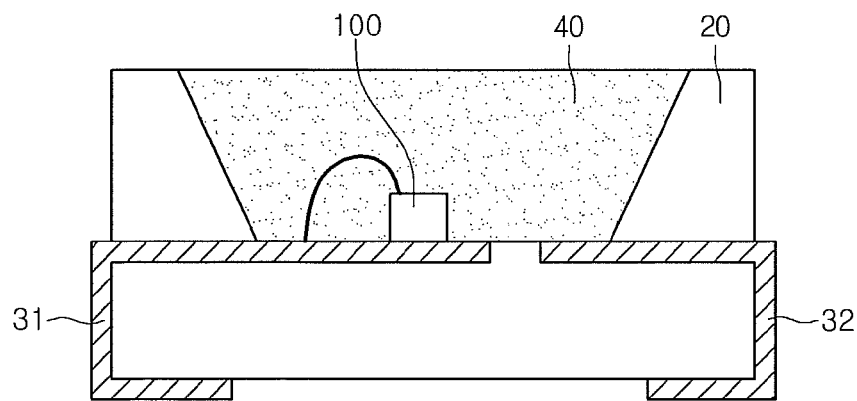
FIG. 14 is a sectional view of a light emitting device package that includes a light emitting device according to an embodiment.

FIG. 14 is a sectional view of a light emitting device package that includes a light emitting device according to an embodiment. Other embodiments and configurations may also be provided.

As shown in FIG. 14, a light emitting device package may include a body 20, first and second lead electrodes 31 and 32 provided on the body 20, the light emitting device 100 provided on the body 20 and electrically connected to the first and second lead electrodes 31 and 32, and a molding member 40 that surrounds the light emitting device 100. The light emitting device may also be the light emitting device 100A.

The body 20 may be formed of a silicon material, a synthetic resin material, and/or a metal material. An inclined surface may be provided around the light emitting device 100.

The first and second lead electrodes 31 and 32 may be electrically separated from each other to supply an electrical power to the light emitting device 100. The first and second lead electrodes 31 and 32 may reflect light generated in the light emitting device 100 to increase light efficiency. The first and second lead electrodes 31 and 32 may discharge heat generated in the light emitting device 100 to the outside.

The light emitting device 100 may be provided on the body 20 and/or may be provided on the first or second lead electrodes 31 or 32.

Although a wire bonding process, in which the light emitting device 100 is electrically connected to the first and second lead electrodes 31 and 32 through a wire, is described in this embodiment, embodiments are not limited thereto. For example, the light emitting device 100 may be connected to the first lead electrode 31 through a wire and/or may be connected to the second lead electrode 32 through a die bonding process.

The molding member 40 may surround the light emitting device 100 to protect the light emitting device 100. A phosphor may be contained in the molding member 40 to change a wavelength of light emitted from the light emitting device 100.

The light emitting device package may include at least one light emitting device or a plurality of light emitting devices, although embodiments are not limited thereto.

Figure 15:
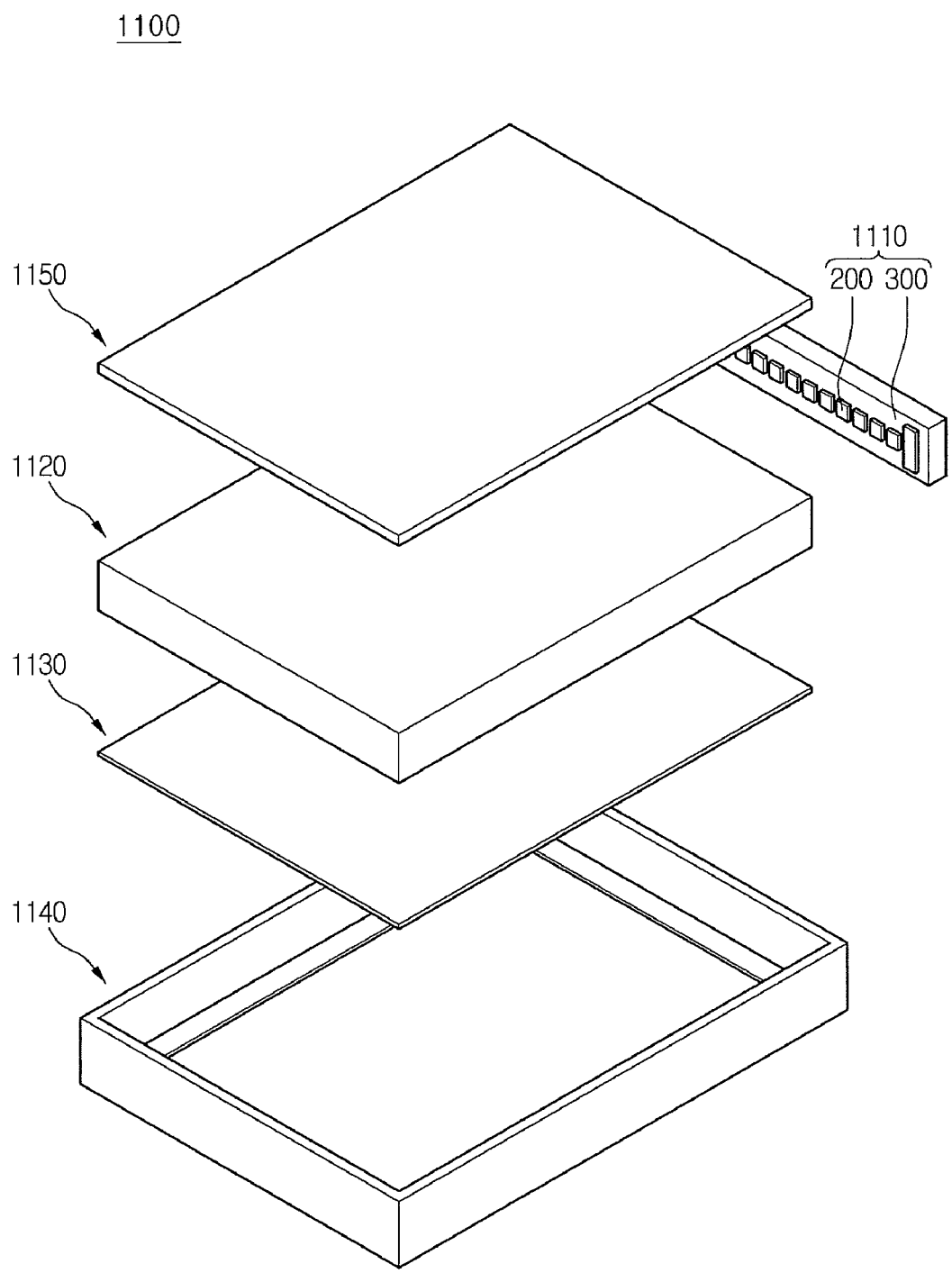
FIG. 15 is a view of a backlight unit that includes the light emitting device package according to an embodiment.

FIG. 15 is a view of a backlight unit that includes the light emitting device package according to an embodiment. Other embodiments and configurations may also be provided. A backlight unit 1100 (of FIG. 15) is described as an example of the lighting system. Embodiments are not limited thereto.

As shown in FIG. 15, the backlight unit 1100 may include a bottom frame 1140, a light guide member 1120 provided within the bottom frame 1140, and a light emitting module 1110 provided on at least one side surface or a bottom surface of the light guide member 1120. A reflective sheet 1130 may be provided under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, although embodiments are not limited thereto.

The light emitting module 1110 may include a board and a plurality of light emitting device packages mounted on the board. The plurality of light emitting device packages may provide light to the light guide member 1120.

As shown in FIG. 15, the light emitting module 1110 may be provided on at least one of inner surfaces of the bottom frame 1140. Thus, the light emitting module 1110 may provide light toward at least one side surface of the light guide member 1120.

The light emitting module 1110 may be provided under the bottom frame 1140 to provide light toward an under surface of the light guide member 1120. Since this structure may vary based on a design of the backlight unit 1100, embodiments are not limited thereto.

The light guide member 1120 may be provided within the bottom frame 1140. The light guide member 1120 may receive the light provided from the light emitting module 1110 to produce planar light, thereby guiding the planar light to a display panel.

For example, the light guide member 1120 may be a light guide panel (LGP). The LGP may be formed of one of a resin-based material such as polymethyl methacrylate (PMMA), a polyethylene terephthalate (PET) resin, a polycarbonate (PC) resin, a cyclic olefin copolymer (COC) resin, and a polyethylene naphthalate (PEN) resin.

An optical sheet 1150 may be provided above the light guide member 1120.

For example, the optical sheet 1150 may include at least one of a diffusion sheet, a light collection sheet, a brightness enhancement sheet, or a fluorescence sheet. For example, the diffusion sheet, the light collection sheet, the brightness enhancement sheet, and/or the fluorescence sheet may be stacked to form the optical sheet 1150. The diffusion sheet 1150 may uniformly diffuse light emitted from the light emitting module 1110, and the diffused light may be collected into the display panel by the light collection sheet. The light emitted from the light collection sheet may be randomly polarized light. The bright enhancement sheet may enhance a degree of polarization of the light emitted from the light collection sheet. For example, the light collection sheet may be a horizontal prism sheet and/or a vertical prism sheet. The bright enhancement sheet may be a dual brightness enhancement film. The fluorescence sheet may be a light transmitting plate or a film that includes a phosphor.

The reflective sheet 1130 may be provided under the light guide member 1120. The reflective sheet 1130 may reflect the light emitted through the bottom surface of the light guide member 1120 toward a light emission surface of the light guide member 1120.

The reflective sheet 1130 may be formed of a material having a superior reflectance, e.g., a PET resin, a PC resin, or a PVC resin, although embodiments are not limited thereto.

Figure 16:
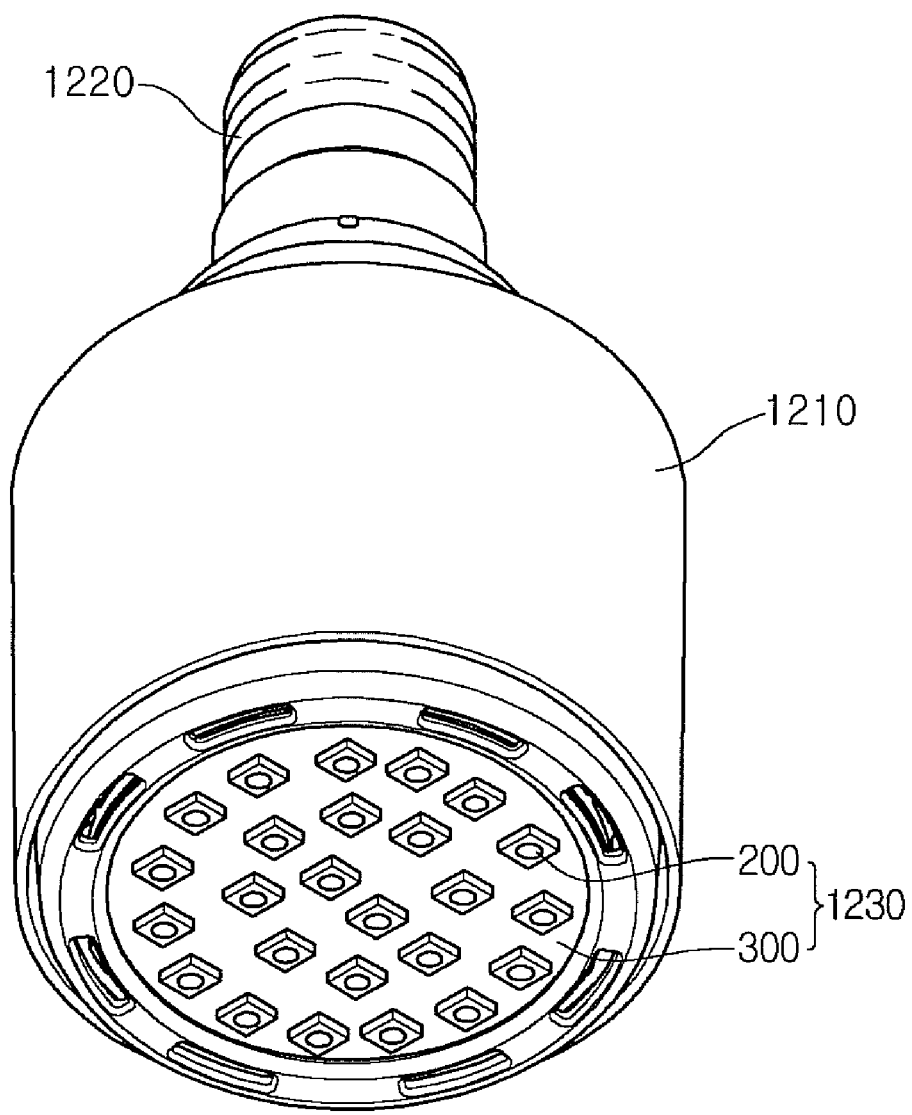
FIG. 16 is a view of a lighting unit that includes the light emitting device or the light emitting device package according to an embodiment.

FIG. 16 is a view of a lighting unit that includes the light emitting device or the light emitting device package according to an embodiment. Other embodiments and configurations may also be provided. A lighting unit 1200 (of FIG. 16) is described as an example of the lighting system. Thus, embodiments are not limited thereto.

As shown in FIG. 16, the lighting unit 1200 may include a case body 1210, a light emitting module 1230 provided on the case body 1210, a connection terminal 1220 provided on the case body 1210 to receive an electrical power from an external power source.

The case body 1210 may be formed of a material having good thermal dissipation properties (e.g., a metal material or a resin material).

The light emitting module 1230 may include a board 300 and at least one light emitting device package 200 mounted on the board 300.

A circuit pattern may be printed on a dielectric to manufacture the board 300. For example, the board 300 may include a printed circuit board (PCB), a metal core PCB, a flexible PCB, and/or a ceramic PCB.

The board 300 may be formed of a material that may effectively reflect light or have a color by which light is effectively reflected (e.g., a white color or a silver color).

The at least one light emitting device package 200 may be mounted on the board 300. The light emitting device package 200 may include at least one light emitting diode (LED). The LED may include colored LEDs that respectively emit light having a red color, a green color, a blue color, and a white color and/or an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. A fluorescence sheet may be further provided on a path of light emitted from the light emitting module 1230. The fluorescence sheet may change a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 may pass through the fluorescence sheet to finally emit white light.

The connection terminal 1220 may be electrically connected to the light emitting module 1230 to supply an electrical power to the light emitting module 1230. Referring to FIG. 15, the connection terminal 1220 may be screw-coupled to an external power source in a socket manner, although embodiments are not limited thereto. For example, the connection terminal 1220 may have a pin shape, and thus may be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and/or the fluorescence sheet may be provided on the path of the light emitted from the light emitting module to obtain a desired optical effect.

Embodiments may provide a light emitting device having a new structure.

Embodiments may also provide a light emitting device having an improved light emitting efficiency. Embodiments may also provide a light emitting device having an improved light extraction efficiency.

Embodiments may also provide a light emitting device for preventing a current from being concentrated.

In at least one embodiment, a light emitting device may include: a light emitting structure including a first conductive type semiconductor layer, an active layer, and a second conductive type semiconductor layer; a conductive layer passing through the second conductive type semiconductor layer and the active layer to contact the first conductive type semiconductor layer; an insulation layer between the first conductive type semiconductor layer, the active layer, and the second conductive type semiconductor layer and the conductive layer; a current blocking layer in a circumference region of the insulation layer; and an electrode on a side of the light emitting structure, the electrode being spaced from the light emitting structure.

In at least one embodiment, a light emitting device may include: a light emitting structure including a first conductive type semiconductor layer, an active layer, and a second conductive type semiconductor layer; a recess that passes through the second conductive type semiconductor layer and the active layer to expose the first conductive type semiconductor layer; a conductive layer that contacts the first conductive type semiconductor layer through the recess; an insulation layer between a side surface of the recess and the conductive layer; a current blocking layer that contacts a circumference region of the insulation layer; and an electrode on a side of the light emitting structure, the electrode being spaced from the light emitting structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device, comprising:
a light emitting structure including a first conductive type semiconductor layer, an active layer, and a second conductive type semiconductor layer;

a conductive layer having a first conductive portion that passes through the second conductive type semiconductor layer and the active layer to contact the first conductive type semiconductor layer;

an insulation layer having a first insulation portion that surrounds the first conductive portion of the conductive layer; and a current blocking layer that circumferentially surrounds and directly contacts the first insulation portion of the insulation layer, the first insulation portion provided between the current blocking layer and the first conductive portion.

2. The light emitting device according to claim 1, wherein the first insulation portion of the insulation layer circumferentially surrounds the first conductive portion of the conductive layer.

3. The light emitting device according to claim 1, further comprising at least one of an ohmic contact layer or a reflective layer under the second conductive type semiconductor layer.

4. The light emitting device according to claim 3, wherein the current blocking layer is between the active layer and the at least one of the ohmic contact layer or the reflective layer.

5. The light emitting device according to claim 3, wherein the first conductive portion of the conductive layer further passes through the at least one of the ohmic contact layer or the reflective layer, and a second conductive portion of the conductive layer is provided under the at least one of the ohmic contact layer or the reflective layer.

6. The light emitting device according to claim 5, wherein a second insulation portion of the insulation layer is provided between the second conductive portion of the conductive layer and the at least one of the ohmic contact layer or the reflective layer.

7. The light emitting device according to claim 3, wherein the at least one of the ohmic contact layer or the reflective layer includes a first portion that is provided under the light emitting structure and a second portion that is provided at an area other than under the light emitting structure.

8. The light emitting device according to claim 1, wherein the current blocking layer contacts the first insulation portion of the insulation layer.

9. The light emitting device according to claim 1, wherein the current blocking layer horizontally protrudes from the first insulation portion of the insulation layer, and the current blocking layer is disposed in a same layer as the second conductive type semiconductor layer, wherein the current blocking layer is disposed between the first insulation portion of the insulation layer and the second conductive type semiconductor layer.

10. The light emitting device according to claim 1, wherein the first insulation portion of the insulation layer, the active layer and the first conductive type semiconductor layer surround surfaces of the current blocking layer.

11. The light emitting device according to claim 10, wherein a lower surface of the current blocking layer directly contacts the active layer.

12. The light emitting device according to claim 10, wherein a lower surface of the current blocking layer is spaced from the active layer.

13. The light emitting device according to claim 1, wherein the current blocking layer has a surface higher than an end of the first insulation portion of the insulation layer.

14. The light emitting device according to claim 1, wherein the current blocking layer includes at least one selected from the group consisting of ITO, IZO, IZTO, IAZO, IGZO, IGTO, AZO, ATO, ZnO, SiO2, SiOx, SiOxNy, Si3N4, Al2O3, and TiOx.

15. The light emitting device according to claim 1, wherein the conductive layer includes at least one selected from the group consisting of Ti, Au, Sn, Ni, Cr, Ga, In, Bi, Cu, Ag, and Ta.

16. The light emitting device according to claim 1, wherein an inner side surface of the current blocking layer contacts an outer side surface of the first insulation portion corresponding to the inner side surface of the current blocking layer in all regions.

17. A light emitting device comprising:

a light emitting structure that includes a first conductive type semiconductor layer, an active layer, and a second conductive type semiconductor layer, wherein the second conductive type semiconductor layer includes an opening and the active layer includes an opening;

a conductive layer that passes through the opening of the active layer and through the opening of the second conductive type semiconductor layer, and the conductive layer extends to the first conductive type semiconductor layer to contact the first conductive type semiconductor layer;

an insulation layer that passes through the opening of the active layer and through the opening of the second conductive type semiconductor layer, and the insulation layer extends to the first conductive type semiconductor layer to contact the first conductive type semiconductor layer; and a current blocking layer that circumferentially surrounds and directly contacts a portion of the insulation layer.

18. The light emitting device according to claim 17, further comprising at least one of an ohmic contact layer or a reflective layer under the second conductive type semiconductor layer, wherein the conductive layer further passes thoroughly the at least one of the ohmic contact layer or the reflective layer, and a portion of the conductive layer is provided under the at least one of the ohmic contact layer or the reflective layer.

19. The light emitting device according to claim 17, wherein the current blocking layer is provided within the first conductive type semiconductor layer.

20. The light emitting device according to claim 17, wherein the conductive layer has a surface that contacts an inside of the first conductive type semiconductor layer.

21. The light emitting device according to claim 17, wherein an inner side surface of the current blocking layer contacts an outer side surface of the portion of the insulation layer corresponding to the inner side surface of the current blocking layer in all regions.

* * * * *